United States Patent
Ma et al.

(10) Patent No.: US 6,888,365 B2
(45) Date of Patent: May 3, 2005

(54) SEMICONDUCTOR WAFER TESTING SYSTEM

(75) Inventors: Daivid Suitwai Ma, Cary, NC (US); James J. Dietz, Durham, NC (US); George W. Alexander, Durham, NC (US)

(73) Assignee: Infineon Technologies North America Corporation, San Jose, CA (US)

( * ) Notice: Subject to any disclaimer, the term of this patent is extended or adjusted under 35 U.S.C. 154(b) by 41 days.

(21) Appl. No.: 10/242,894

(22) Filed: Sep. 12, 2002

(65) Prior Publication Data

US 2004/0051547 A1 Mar. 18, 2004

(51) Int. Cl.[7] .......................... G01R 31/02; G01R 31/26
(52) U.S. Cl. ..................... 324/763; 324/158.1; 324/765
(58) Field of Search ....................... 324/158.1, 750–765

(56) References Cited

U.S. PATENT DOCUMENTS

| | | | |
|---|---|---|---|
| 4,956,602 A | 9/1990 | Parrish | |
| 5,053,700 A | * 10/1991 | Parrish | 324/537 |
| 5,059,899 A | * 10/1991 | Farnworth et al. | 438/18 |
| 6,046,600 A | 4/2000 | Whetsel | |
| 6,166,557 A | 12/2000 | Whetsel | |
| 6,233,184 B1 | 5/2001 | Barth et al. | |

OTHER PUBLICATIONS

Keeth, Brent et al., "DRAM Circuit Design A Tutorial," IEE Press Series on Microelectronic Systems, 24 pages.

* cited by examiner

*Primary Examiner*—Evan Pert
*Assistant Examiner*—Emily Y Chan
(74) *Attorney, Agent, or Firm*—Brinks Hofer Gilson & Lione

(57) ABSTRACT

A semiconductor wafer testing system tests one or more die clusters on a semiconductor wafer, using a test circuit to test multiple sections or areas of each die in parallel. The semiconductor wafer testing system has a buffer connected to the die cluster via the test circuit. The buffer writes test data onto a section of each die in the die cluster. The buffer reads test data from the section of each die in the die cluster.

17 Claims, 3 Drawing Sheets

SEMICONDUCTOR WAFER TESTING SYSTEM

RELATED APPLICATIONS

The following copending and commonly assigned U.S. patent applications have filed on the same day as this application. All of these applications relate to and further describe other aspects of this application and are incorporated herein by reference in their entirety.

U.S. patent application Ser. No. 10/243,544, entitled "System and Method for Testing One on More Dies or a Semiconductor Wafer," on Sep. 12, 2002, U.S. patent application Ser. No. 10/243,363, entitled "Die Isolation System for Semiconductor Wafer Testing," filed on Sep. 12, 2002.

FIELD

This invention generally relates to semiconductor wafer testing methods and devices. More particularly, this invention relates to semiconductor wafer testing systems providing parallel testing of dies on a semiconductor wafer.

BACKGROUND

Integrated circuits typically begin fabrication as a die on a flat, circular substrate or wafer. The die comprises a rectangular portion of the wafer surface and is also known as a chip, circuit, or the like. Each wafer usually is segmented by scribe or saw lines into multiple dies, which typically form essentially identical rectangular circuit patterns. Some dies may be engineering or test dies. Other dies may be edge dies where the wafer does not permit the formation of a complete die along the edge of the wafer. On many wafers, there is a kerf area or area between the dies. The size of the kerf area varies as the number and arrangement of the dies on the wafer varies. When fabrication is completed, the wafer is cut along the kerf area to separate the dies for use in IC devices.

Dies are tested after fabrication to determine whether a suitable IC has been manufactured. The dies may be individually tested after separation of the wafer. The dies also may be serially tested before separation of the wafer. Die testing usually involves the use of mechanical probes from a testing device. The mechanical probes engage test pads or pins on the die. Once engaged, the testing device applies input signals or voltages to the die and then receives output signals or voltages from the die.

Generally, the testing device needs to have the same number of data tester channels as the number of data pins on the die. If a die has eight data pins, then eight data tester channels usually are connected to the eight test pins on the die for reading and writing data. In this type of testing system, the maximum number of dies that can be tested at the same time is equal to the total number of data tester channels divided by the number of data pins per die.

In other testing systems, dies are connected in parallel on the wafer. Each die has separate data pins for testing different sections or areas of the die. Data pins for similar sections or areas of each die are interconnected via a bus or other routing mechanism with a wafer test pad. Similar data pins on each die perform the same test on each die or test the same portion of each die. During testing, a data tester channel is connected to each wafer test pad for reading and writing data to the same section or area of each die. While multiple dies are tested in parallel, the testing device can test only a limited number of dies. The number of dies tested at the same time is limited by the number of data pins on each die, and hence the number of data tester channels required per die. Many testing devices have a limited number of available channels for testing.

SUMMARY

This invention provides a semiconductor wafer testing system that tests one or more die clusters on a semiconductor wafer. The semiconductor wafer testing system uses a test circuit to test multiple sections or areas of each die in parallel.

The semiconductor wafer testing system may have a buffer, a plurality of dies, and a test circuit. The test circuit connects the buffer to the plurality of dies. The buffer writes test data onto a section of each die in the plurality of dies through the test circuit. The buffer reads the test data from the section of each die through the test circuit.

The semiconductor wafer testing system also may have a first die cluster, a second die cluster, and a wafer test pad. The first die cluster is connected to a first buffer through a first routing mechanism. The second die cluster is connected to a second buffer through a second routing mechanism. The wafer test pad is connected to the first and second buffers through a bus. The first and second buffers receive a write signal from the wafer test pad. The first buffer writes a first portion of the write signal onto a section of each die in the first die cluster. The second buffer writes a second portion of the write signal onto a first area of each die in the second die cluster. The first buffer reads the first portion of the write signal from the first section of each die in the first die cluster. The second buffer reads the second portion of the write signal from the first area of each die in the second die cluster.

In a method for testing a semiconductor wafer, test data is written from a buffer through a test circuit onto a section of at least one die. The test data is read from the first section of the at least one die through the test circuit.

Other systems, methods, features, and advantages of the invention will be or will become apparent to one skilled in the art upon examination of the following figures and detailed description. All such additional systems, methods, features, and advantages are intended to be included within this description, within the scope of the invention, and protected by the accompanying claims.

BRIEF DESCRIPTION OF THE FIGURES

The invention may be better understood with reference to the following figures and detailed description. The components in the figures are not necessarily to scale, emphasis being placed upon illustrating the principles of the invention. Moreover, like reference numerals in the figures designate corresponding parts throughout the different views.

DETAILED DESCRIPTION OF THE PREFERRED EMBODIMENTS

Figure 1:
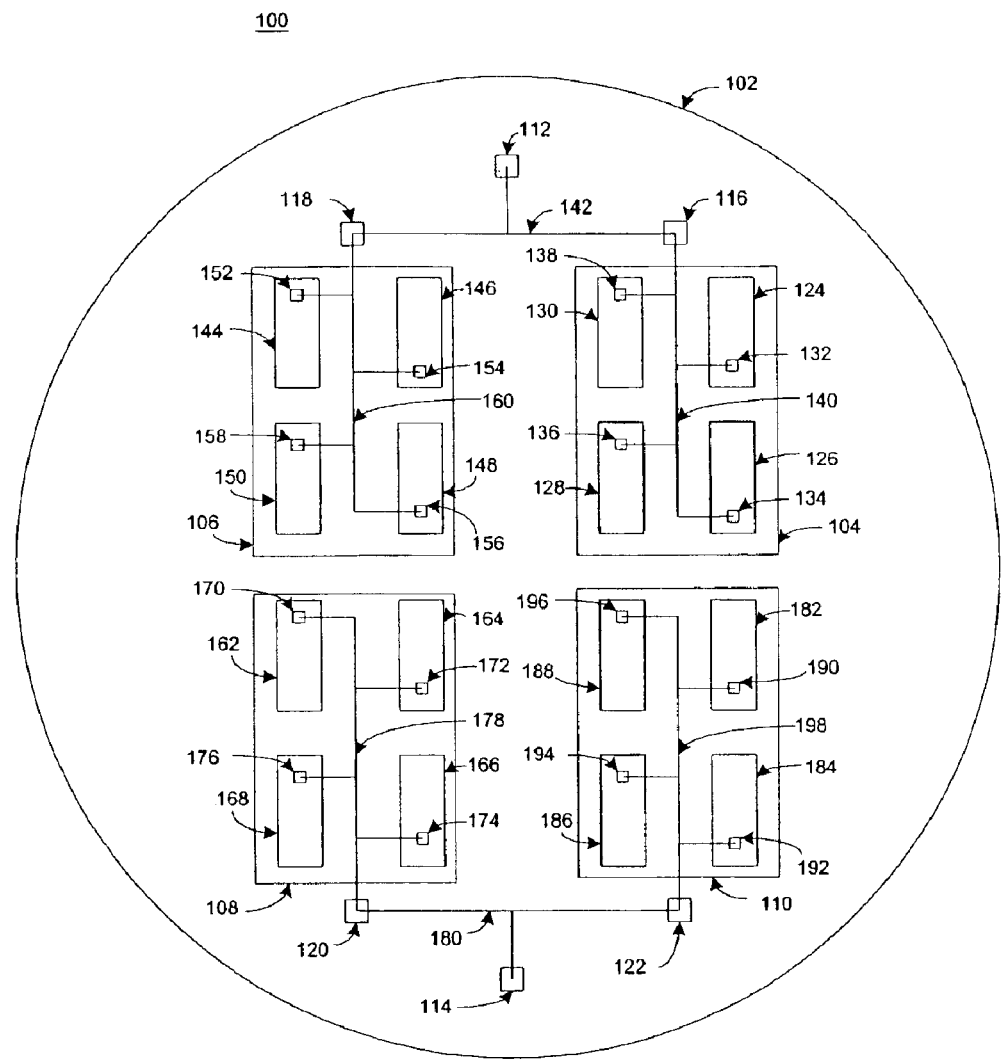
FIG. 1 is a block diagram of a semiconductor wafer testing system according to an embodiment.

FIG. 1 is a block diagram of a semiconductor wafer testing system 100 according to an embodiment. The semiconductor wafer testing system 100 includes a semiconductor wafer 102 with die clusters 104, 106, 108, and 110 connected to wafer test pads 112 and 114 via buffers 116, 118, 120, and 122. The semiconductor wafer testing system 100 writes and reads data to dies in the die clusters for determining whether the dies are suitable to use as integrated circuits and the like. The semiconductor wafer testing system 100 can test one or more die clusters or groups of dies in parallel using a test circuit to test multiple sections or areas of each die. There may be additional die clusters and buffers connected to wafer test pads 112 and 114. There may be other wafer test pads connected to other buffers and die clusters. The buffers 116, 118, 120, and 122 may include other circuitry. The buffers amplify or otherwise strengthen the signals when the semiconductor testing system 100 writes and reads data to and from the dies. The die clusters 104, 106, 108, and 110, buffers 116, 118, 120, and 121, wafer test pads 112 and 114, and other components may be formed on the semiconductor wafer 102 using a photolithographic or similar process for manufacturing an integrated circuit. While particular configurations are shown and described, other configurations may be used including those with fewer or additional components.

Die cluster 104 includes dies 124, 126, 128, and 130, each with a die test pad 132, 134, 136, and 138 respectively. Die test pads 132, 134, 136, and 138 are connected via a first test circuit to wafer test pad 112. The first test circuit comprises a first routing mechanism 140 connected to a bus 142 through buffer 116.

Die cluster 106 includes dies 144, 146, 148, and 150, each with a die test pad 152, 154, 156, and 158, respectively. The die test pads 152, 154, 156, and 158 are connected via a second test circuit to wafer test pad 112. The second test circuit comprises a second routing mechanism 160 connected to bus 142 through buffer 118.

Die cluster 108 includes dies 162, 164, 166, and 168, each with a die test pad 170, 172, 174, and 176, respectively. The die test pads 170, 172, 174, and 176 are connected via a third test circuit to wafer test pad 114. The third test circuit comprises a third routing mechanism 178 connected to a bus 180 through buffer 120.

Die cluster 110 includes dies 182, 184, 186, and 188, each with a die test pads 190, 192, 194, and 196, respectively. The die test pads 190, 192, 194, and 196 are connected via a fourth test circuit to wafer test pad 114. The fourth test circuit comprises a fourth routing mechanism 198 connected to bus 180 through buffer 122.

The dies within each die cluster may have the same configuration. Each die may have multiple die test pads. All the dies on the semiconductor wafer may have the same configuration. The dies within one die cluster may be different from the dies in one or more of the other die clusters. The dies within a die cluster may be different from the other dies in that die cluster. While each die cluster is illustrated with four dies, the die clusters may have fewer or additional dies and may have different numbers of dies.

In operation, a testing device (not shown) is connected to the wafer test pads 112 and 114 on the semiconductor wafer 102. The testing device has a first data pin (not shown) for connecting a first tester channel (not shown) to wafer test pad 112. The testing device also has a second data pin (not shown) for connecting a second tester channel (not shown) to wafer test pad 114. The testing device writes data onto the dies and then reads the data to determine whether the "read data" is the same as the "write data" for each die.

The testing device provides test or write signals to buffers 116 and 118 via bus 142. The testing device also provides test or write signals to buffers 120 and 122 via bus 180. The test or write signals may be the same or different depending on the desired testing. There may be multiple tests or write signals for testing different sections or areas of the dies.

Buffers 116 and 118 hold all or a portion of the test or write signal for their respective die clusters 104 and 106. Buffer 116 provides at least a portion of the test or write signal to dies 124, 126, 128, and 130 in die cluster 104 at essentially the same time. In response to a control signal, dies 124, 126, 128, and 130 provide read data to buffer 116 for transmission to the testing device. Buffer 118 also provides at least a portion of the test or write signal to dies 144, 146, 148, and 150 in die cluster 106 at essentially the same time. In response to the control signal, dies 144, 146, 148, and 150 provide read data to buffer 118 for transmission to the testing device. The testing device may receive additional read data from the dies 144, 146, 148 and 150 in response to additional test or write signals. The additional test or write signals may be for testing the same area or section of the die and may be for testing another area or section of each die.

Similarly, buffers 120 and 122 may hold all or a portion of the test or write signal for their respective die clusters 108 and 110. Buffer 120 provides at least a portion of the test or write signal to dies 162, 164, 166, and 168 in die cluster 108 at essentially the same time. In response to the control signal, dies 162, 164, 166, and 168 provide read data to buffer 120 for transmission to the testing device. Buffer 122 also provides at least a portion of the test or write signal to dies 182, 184, 186, and 188 at essentially the same time. In response to the control signal, dies 182, 184, 186, and 188 provide read data to buffer 122 for transmission to the testing device. The testing device also may receive additional read data from the dies 182, 184, 186, and 188 in response to additional test or write signals for testing the same or other areas or sections of each die.

Figure 2:
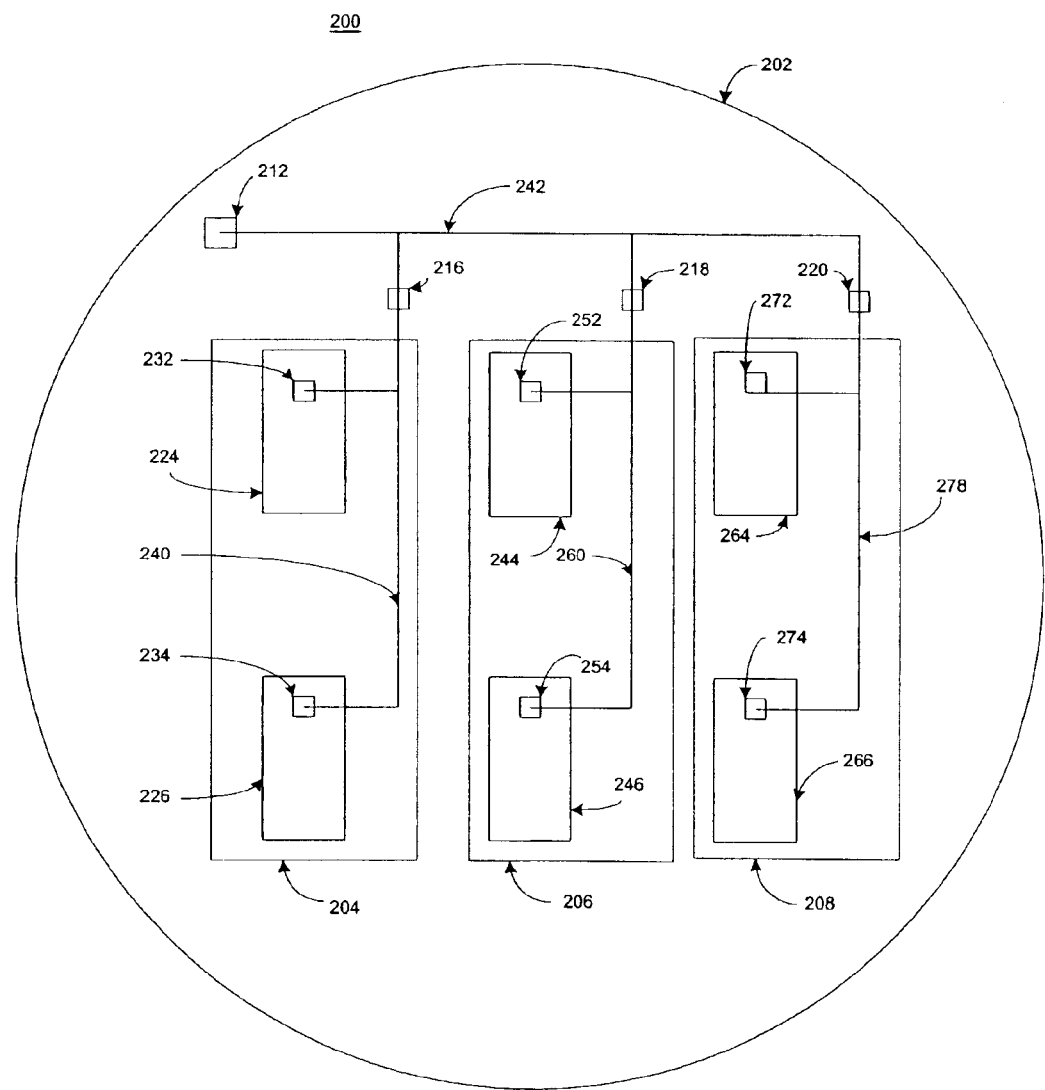
FIG. 2 is a block diagram of a semiconductor wafer testing system according to another embodiment.

FIG. 2 is a block diagram of a semiconductor wafer testing system 200 according to another embodiment. The semiconductor wafer testing system 200 includes a semiconductor wafer 202 with die clusters 204, 206, and 208 each connected to wafer test pad 212 via buffers 216, 218, and 220 respectively. The die clusters 204, 206, and 208 may be formed on the semiconductor wafer 202 using a photolithographic or similar process for manufacturing an integrated circuit. There may be additional die clusters and buffers connected to wafer test pad 212. Buffers 216, 218, and 220 may include additional circuitry. The buffers amplify or otherwise strengthen the signals when the semiconductor testing system 100 writes and reads data to and from the dies. While particular configurations are shown and described, other configurations may be used including those with additional or fewer components.

Die cluster 204 includes dies 224 and 226, each with a die test pad 232 and 234 respectively. Die test pads 232 and 234 are connected via a first test circuit to wafer test pad 212. The first test circuit comprises a first routing mechanism 240 connected to a bus 242 through buffer 216.

Die cluster 206 includes dies 244 and 246, each with a die test pad 252 and 254 respectively. Die test pads 252 and 254 are connected via a second test circuit to wafer test pad 212. The second test circuit comprises a second routing mechanism 260 connected to bus 242 through buffer 218.

Die cluster 208 includes dies 264 and 266, each with a die test pad 272 and 274 respectively. Die test pads 272 and 274 are connected via a third test circuit to wafer test pad 212. The third test circuit comprises a third routing mechanism 278 connected to bus 242 through buffer 220.

Each die cluster 204, 206, and 208 may have the same dies as the other die clusters. The dies within a die cluster may be different from dies in another die cluster. Each die cluster 204, 206, and 208 may have fewer or additional dies and may have different numbers of dies.

In operation a testing device (not shown) is connected to wafer test pad 212. The testing device transmits a first test or write signal to buffers 216, 218, and 220 via bus 242. The first write signal tests a first section or area of each die in the die clusters 204, 206, and 208. Buffers 216, 218, and 220 each hold a portion of the first write signal for their respective die clusters 204, 206, and 208. The portion of the first write signal may be different for each die cluster 204, 206, and 208.

Buffer 216 writes a first portion of the first write signal onto dies 224 and 226 in die cluster 204. In response to a first control signal from the testing device, dies 224 and 226 provide first read data to buffer 216 for transmission to the testing device. The control and write signals may be part of the same signal or different signals from the testing device. Buffer 218 writes a second portion of the first write signal onto dies 244 and 246 in die cluster 206. In response to the first control signal, dies 244 and 246 provide first read data to buffer 218 for transmission to the testing device. Buffer 220 writes a third portion of the first write signal onto dies 264 and 266 in die cluster 208. In response to the first control signal, dies 264 and 266 provide first read data to buffer 220 for transmission to the testing device.

After the testing device receives the read data from the first section or area of each die in the die clusters 204, 206, and 208, the testing device transmits a second test or write signal to buffers 216, 218, and 220 via bus 242. The second write signal tests a second section or area of each die in the die clusters 204, 206, and 208. Buffers 216, 218, and 220 each hold a portion of the second write signal for their respective die clusters 204, 206, and 208. The portions of the second write signal may be different for each die cluster 204, 206, and 208.

Buffer 216 writes a first portion of the second write signal onto dies 224 and 226 in die cluster 204. In response to a second control signal from the testing device, dies 224 and 226 provide second read data to buffer 216 for transmission to the testing device. Buffer 218 writes a second portion of the second write signal onto dies 244 and 246 in die cluster 206. In response to the second control signal, dies 244 and 246 provide second read data to buffer 218 for transmission to the testing device. Buffer 220 writes a third portion of the second write signal onto dies 264 and 266 in die cluster 208. In response to the second control, dies 264 and 266 provide second read data to buffer 220 for transmission to the testing device. Additional write signals from the testing device may be processed similarly and may be used to test the same or different sections or areas of the dies.

Figure 3:
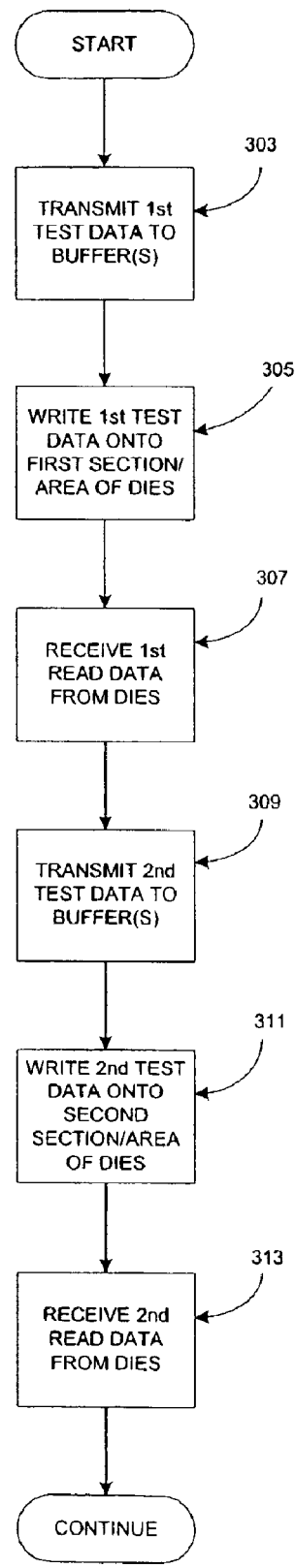
FIG. 3 is a flowchart of a method of one embodiment for testing a semiconductor wafer.

FIG. 3 is a flowchart of a method of one embodiment for testing a semiconductor wafer. A testing device transmits 303 first test data to one or more buffers on a semiconductor wafer via a wafer test pad and test circuit, which comprises a routing mechanism and bus as previously discussed. Each buffer writes 305 all or a portion of the first test data onto a first section or area of each die in a die cluster. Each buffer may write a different portion of the first test data onto the first section or area of the respective dies. The testing device receives 307 first read data from each die in a die cluster via the buffer. The testing device transmits 309 second test data to the one or more buffers via the wafer test pad and test circuit. Each buffer writes 311 all or a portion of the second test data onto a second section or area of each die. Each buffer may write a different portion of the second test data onto the second section or area of the respective dies. The testing device receives 313 second read data from each die in a die cluster via the buffer as previously discussed.

Various embodiments of the invention have been described and illustrated. However, the description and illustrations are by way of example only. Other embodiments and implementations are possible within the scope of this invention and will be apparent to those of ordinary skill in the art. Therefore, the invention is not limited to the specific details, representative embodiments, and illustrated examples in this description. Accordingly, the invention is not to be restricted except in light as necessitated by the accompanying claims and their equivalents.

What is claimed is:

1. A semiconductor wafer testing system, comprising:
   a first buffer on a semiconductor wafer;
   a first plurality of dies; and
   a first test circuit connecting the first buffer to the first plurality of dies;
   where the first buffer writes test data onto a section of each die in the first plurality of dies through the first test circuit,
   where the first buffer reads the test data from the section of each die through the first test circuit, and
   where the first buffer writes additional test data onto another section of each die through the first test circuit, and where the first buffer reads the additional test data from the other section of each die through the first test circuit.

2. The semiconductor wafer testing system according to claim 1, where the test circuit comprises a routing mechanism and a bus connected to the buffer.

3. The semiconductor wafer testing system according to claim 2, where the routing mechanism connects to a die test pad on each die.

4. The semiconductor wafer testing system according to claim 2, where the bus connects to a wafer test pad.

5. The semiconductor wafer testing system according to claim 1, further comprising:
   a second buffer on the semiconductor wafer;
   a second plurality of dies; and
   a second test circuit connecting the second buffer to the second plurality of dies;
   where the second buffer writes second test data onto an area of each die in the second plurality of dies through the second test circuit; and
   where the second buffer reads the second test date from the area of each die in the second plurality of dies through the second test circuit.

6. The semiconductor wafer testing system according to claim 5, further comprising a bus connecting the first and second buffers to a wafer test pad.

7. The semiconductor wafer testing system according to claim 6, where the first and second test data comprise a write signal.

8. The semiconductor wafer testing system according to claim 5, further comprising:
   a first bus connecting the first buffer to a first wafer test pad; and
   a second bus connecting the second buffer to a second wafer test pad.

9. The semiconductor wafer testing system according to claim 8, where the first buffer receives the first test data through the first wafer test pad, and where the second buffer receives the second test data device through the second wafer test pad.

10. A semiconductor wafer testing system, comprising:
- a first buffer on a semiconductor wafer;
- a first plurality of dies;
- a first test circuit connecting the first buffer to the first plurality of dies;
- where the first buffer writes test data onto a section of each die in the first plurality of dies through the first test circuit,
- where the first test buffer reads the test data from the section of each die through the first test circuit,
- a second buffer on the semiconductor wafer;
- a second plurality of dies;
- a second test circuit connecting the second buffer to the second plurality of dies;
- where the second buffer writes second test data onto an area of each die in the second plurality of dies through the second test circuit,
- where the second buffer reads the second test date from the area of each die in the second plurality of dies through the second test circuit,
- where the second buffer writes additional second test data onto another area of each die in the second plurality of dies through the second test circuit, and
- where the second buffer reads the additional second test data from the other area of each die in the second plurality of dies through the second test circuit.

11. The semiconductor wafer testing system according to claim 5, where the second test circuit comprises a routing mechanism and a bus connected to the second buffer.

12. The semiconductor wafer testing system according to claim 11, where the routing mechanism connects to a die test pad on each die in the second plurality of dies.

13. The semiconductor wafer testing system according to claim 11, where the bus connects to a wafer test pad.

14. A semiconductor wafer testing system, comprising:
- a first die cluster connected to a first buffer through a first routing mechanism, where the first buffer is on a semiconductor wafer;
- a second die cluster connected to a second buffer through a second routing mechanism, where the second buffer is on the semiconductor wafer, wherein the dies within each cluster have the same configuration; and
- a wafer test pad connected to the first and second buffers through a bus;
- where the first and second buffers receive a first write signal from the wafer test pad,
- where the first buffer writes a first portion of the first write signal onto a first section of each die in the first die cluster at essentially the same time,
- where the second buffer writes a second portion of the first write signal onto a first area of each die in the second die cluster at essentially the same time,
- where the first buffer reads the first portion of the first write signal from the first section of each die in the first die cluster, and
- where the second buffer reads the second portion of the first write signal from the first area of each die in the second die cluster.

15. A semiconductor wafer testing system, comprising:
- a first die cluster connected to a first buffer through a first routing mechanism, where the first buffer is on a semiconductor wafer;
- a second die cluster connected to a second buffer through a second routing mechanism, where the second buffer is on the semiconductor wafer; and
- a wafer test pad connected to the first and second buffers through a bus;
- where the first and second buffers receive a first write signal from the wafer test pad,
- where the first buffer writes a first portion of the first write signal onto a first section of each die in the first die cluster,
- where the second buffer writes a second portion of the first write signal onto a first area of each die in the second die cluster,
- where the first buffer reads the first portion of the first write signal from the first section of each die in the first die cluster, and
- where the second buffer reads the second portion of the first write signal from the first area of each die in the second die cluster;
- where the first and second buffers receive a second write signal from the wafer test pad,
- where the first buffer writes a first portion of the second write signal onto a second section of each die in the first die cluster,
- where the second buffer writes a second portion of the second write signal onto a second area of each die in the second die cluster,
- where the first buffer reads the first portion of the second write signal from the second section of each die in the first die cluster, and
- where the second buffer reads the second portion of the second write signal for the second area of each die in the second die cluster.

16. The semiconductor wafer testing system according to claim 14, where the first routing mechanism connects to die test pads on the dies in the first die cluster, and where the second routing mechanism connects to other die test pads on the dies in the second die cluster.

17. The semiconductor wafer system according to claim 14, further comprising:
- a third die cluster connected to a third buffer through a third routing mechanism, the third buffer is on the semiconductor wafer and connected to the wafer test pad via the bus,
- where the third buffer receives the first write signal from the wafer test pad,
- where the third buffer writes a third portion of the first write signal onto a section of the dies in the third die cluster,
- where the third buffer reads the third portion of the first write signal from the section of the dies in the third die cluster.

* * * * *